(12) United States Patent
Nandakumar

(10) Patent No.: US 8,981,490 B2
(45) Date of Patent: Mar. 17, 2015

(54) TRANSISTOR WITH DEEP NWELL IMPLANTED THROUGH THE GATE

(71) Applicant: Texas Instruments Incorporated, Dallas, TX (US)

(72) Inventor: Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/827,439

(22) Filed: Mar. 14, 2013

(65) Prior Publication Data

US 2014/0264623 A1   Sep. 18, 2014

(51) Int. Cl.
| H01L 29/76 | (2006.01) |
| H01L 29/94 | (2006.01) |
| H01L 21/8236 | (2006.01) |
| H01L 29/78 | (2006.01) |
| H01L 21/336 | (2006.01) |
| H01L 29/778 | (2006.01) |
| H01L 27/092 | (2006.01) |
| H01L 21/8238 | (2006.01) |

(52) U.S. Cl.
CPC .... *H01L 27/0928* (2013.01); *H01L 21/823814* (2013.01); *H01L 21/823892* (2013.01)
USPC ........... 257/371; 257/365; 257/369; 257/382; 257/288; 257/287; 257/E29.266; 257/E21.437; 257/E21.618; 257/E21.633; 438/276; 438/282; 438/289; 438/287

(58) Field of Classification Search
CPC ............... H01L 21/823807; H01L 21/823814;
H01L 21/823857; H01L 21/823892; H01L 29/0847; H01L 29/1033; H01L 29/1087; H01L 29/66659; H01L 29/7835
USPC .......... 257/E21.435, E21.634, 335, 365–380; 438/232, 286, 289
See application file for complete search history.

(56) References Cited

U.S. PATENT DOCUMENTS

| 5,608,253 | A * | 3/1997 | Liu et al. ....................... 257/365 |
| 6,630,710 | B1 * | 10/2003 | Augusto ........................ 257/327 |
| 7,271,449 | B2 * | 9/2007 | Misaki et al. ................. 257/368 |
| 7,595,243 | B1 * | 9/2009 | Bulucea et al. ............... 438/276 |
| 8,530,298 | B2 * | 9/2013 | Roybal et al. ................. 438/202 |
| 2010/0244143 | A1 * | 9/2010 | Yang et al. .................... 257/370 |
| 2011/0147850 | A1 | 6/2011 | Nandakumar et al. |
| 2011/0147854 | A1 * | 6/2011 | Nandakumar et al. ........ 257/382 |

* cited by examiner

*Primary Examiner* — Marcos D. Pizarro
*Assistant Examiner* — Nelson Garces
(74) *Attorney, Agent, or Firm* — Jacqueline J. Garner; Frederick J. Telecky, Jr.

(57) ABSTRACT

A method of fabricating a CMOS integrated circuit (IC) includes implanting a first n-type dopant at a first masking level that exposes a p-region of a substrate surface having a first gate stack thereon to form NLDD regions for forming n-source/drain extension regions for at least a portion of a plurality of n-channel MOS (NMOS) transistors on the IC. A p-type dopant is implanted at a second masking level that exposes an n-region in the substrate surface having a second gate stack thereon to form PLDD regions for at least a portion of a plurality of p-channel MOS (PMOS) transistors on the IC. A second n-type dopant is retrograde implanted including through the first gate stack to form a deep nwell (DNwell) for the portion of NMOS transistors. A depth of the DNwell is shallower below the first gate stack as compared to under the NLDD regions.

10 Claims, 5 Drawing Sheets

TRANSISTOR WITH DEEP NWELL IMPLANTED THROUGH THE GATE

FIELD

Disclosed embodiments relate to semiconductor fabrication, more particularly to fabrication of Complementary Metal-Oxide Semiconductor (CMOS) integrated circuits that include deep Nwells (DNwells), and IC devices therefrom.

BACKGROUND

With the advent of metal-gate on high-k gate dielectric process flows, Positive Bias Temperature Instability (PBTI) has become important for n-Channel MOS (NMOS). The magnitude of PBTI is about 70% the threshold voltage shift ($\Delta$Vt) of Negative Bias Temperature Instability (NBTI) in 20 nm gate length IC manufacturing process technologies.

A Static Random Access Memory (SRAM) is conventionally screened using Nwell reverse-body-bias (RBB) to effectively mimic p-channel MOS (PMOS) end-of-the-line (EOL) Vt degradation. SRAM capability to provide NMOS Driver/pass-gate (PG) transistor screening for PBTI EOL is also desired. A deep Nwell (DNwell)/Iso Pwell implant has been suggested for SRAMs to provide the added diode for back bias capability to allow screening NMOS driver transistors and PG transistors. The DNwell requires a separate mask pattern which is performed before gate dielectric and gate electrode formation. The separate masking level required for the DNwell adds to cost and cycle time.

SUMMARY

Disclosed embodiments include methods of fabricating Complementary Metal-Oxide Semiconductor (CMOS) integrated circuits (ICs) including implanting deep Nwells (DNwells) including through the gate stack for NMOS devices, and optionally also for PMOS devices, without the need for any added masks. Applied to ICs including Static RAMs (SRAMs), disclosed embodiments enable forming DNwells to provide an isolation diode for back bias capability to allow NMOS Driver/pass gate (PG) screening for Positive Bias Temperature Instability (PBTI) end-of-the-line (EOL), without the need for an added (dedicated) DNwell masking level.

Regarding disclosed methods, a retrograde implant of an n-type species includes implanting through the gate stack for NMOS devices to form a DNwell for at least a portion of the NMOS transistors on the IC. With regard to the completed IC product, implanting the DNwell through the gate results in the depth of the DNwell being shallower below the NMOS gate stack as compared to a depth of the DNwell under the n-type lightly doped drain (NLDD) and n-type source/drain (NSD) regions of the NMOS, with the difference in DNwell depth being determined by the thickness (blocking power) of the gate electrode during the implant to form the DNwell (e.g., 30 nm to 100 nm for a polysilicon gate). The gate electrodes including those implanted through by the implant for the DNwell can be replaced with metal gates for replacement metal gate process flows.

BRIEF DESCRIPTION OF THE DRAWINGS

Reference will now be made to the accompanying drawings, which are not necessarily drawn to scale, wherein.

DETAILED DESCRIPTION

Figure 1A:
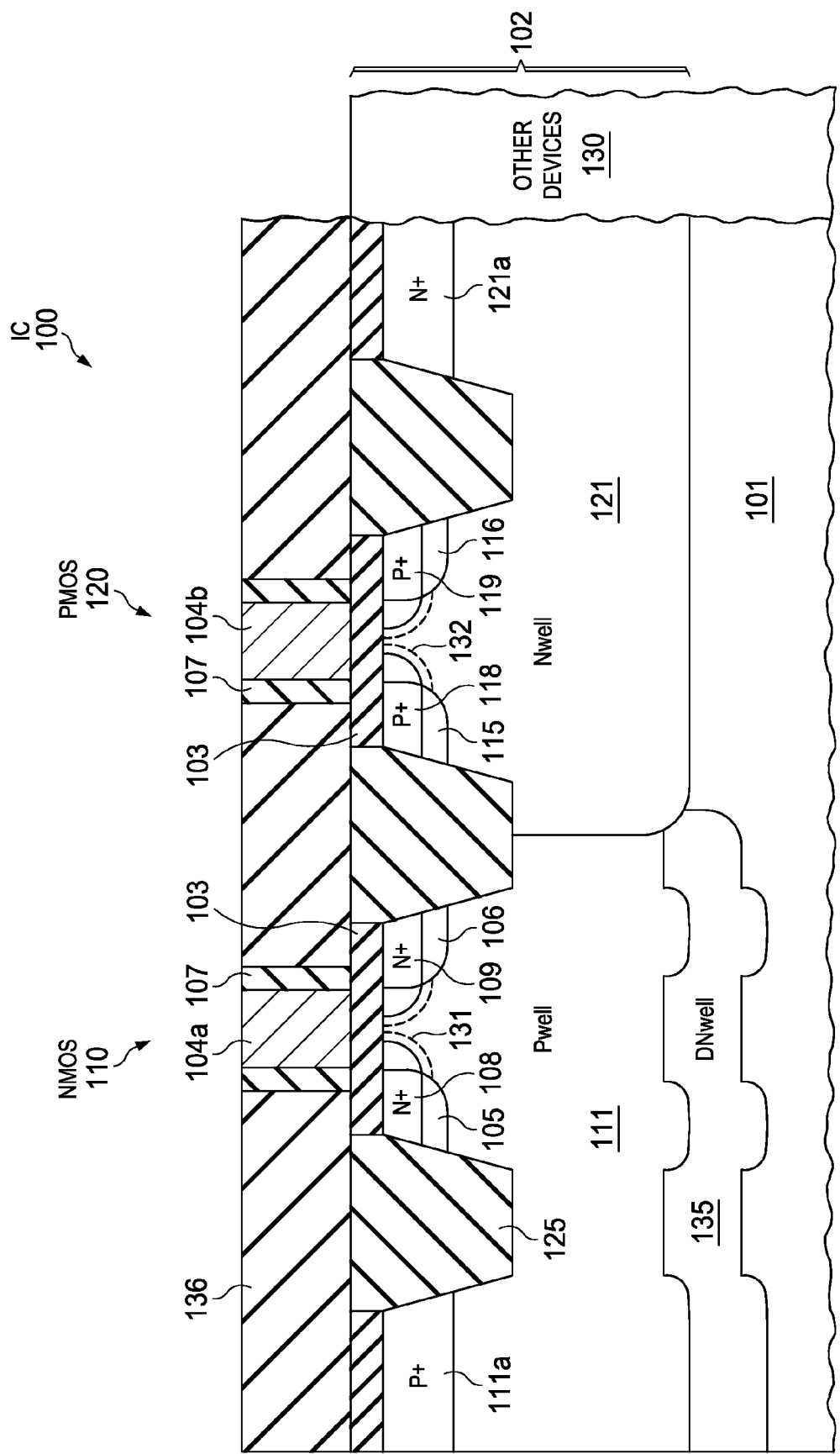
FIG. 1A is a cross-section view of a portion of a CMOS IC including MOS transistors shown as an NMOS transistor and a PMOS transistor after completion of doping and annealing using a fabrication method including forming DNwells through the gate stack of the NMOS, without the need for any added masks, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a cross-section view of a portion of a CMOS IC 100 including MOS transistors shown as an NMOS transistor 110 (NMOS 110) and a PMOS transistor 120 (PMOS 120) after completion of doping and annealing using a fabrication method including forming DNwells 135 through the gate stack for the NMOS 110, without the need for any added masks according to an example embodiment. In the embodiment shown, an implant for the DNwell 135 was performed at the n lightly doped drain (NLDD)/p-pocket masking level. None of the contacts or back end of the line (BEOL) formed layers are shown in FIG. 1A or other FIGs. herein for simplicity, including contacts, multi-layer metallization, and passivation.

IC 100 comprises a substrate 101 having a substrate surface 102 shown as a p-type surface having a pwell 111 and an n− surface comprising an nwell 121 formed therein. Substrate 101 can be single-crystal (e.g. silicon, or SiGe). The substrate surface 102 may comprise an epitaxial layer on a single-crystal substrate 101. In the case of an IC including SRAM, if the substrate 101 is a n-substrate, a deep pwell is added to isolate the nwell in the SRAM load from the n-substrate. In this case of a n-substrate, deep pwell implants are implanted at the PMOS source and drain extensions (PLDD) and/or NMOS source and drain extensions (NLDD).

NMOS 110 is shown formed in pwell 111 that is implanted and/or diffused into the substrate surface 102, and PMOS 120 is shown formed in an nwell 121 that is implanted and/or diffused into the substrate surface 102. A gate stack comprising a gate dielectric 103 with a gate electrode 104a thereon is on the top surface of the pwell 111 for NMOS 110, and a gate electrode 104b thereon is on the top surface of the nwell 121 for PMOS 120. NMOS 110 includes an N+ source 105, and an N+ drain 106 (NSD 105, 106) and PMOS 120 includes a p+ source 115 and a p+ drain 116.

The gate dielectric 103 can comprise, for example, 1 to 3 nanometer thick silicon oxide, nitrogen doped silicon dioxide, silicon oxynitride, barium strontium titanate (BST), Lead Zirconate Titanate (PZT), hafnium oxide, hafnium oxynitride, hafnium silicon oxynitride or any other high-k material, or any combination or stack thereof. Gate electrode 104a can comprise polycrystalline silicon which may be undoped or doped n-type for NMOS 110 and gate electrode 104b can comprise polycrystalline silicon which may be undoped or doped p-type for PMOS 120, with an optional silicide formed on top, or fully silicided, or a combination of one or more metals such as titanium, tungsten, aluminum, zirconium, TiN, tantalum, or TaN for replacement metal gate embodiments described below. In addition, NMOS 110 and PMOS 120 have spacers 107 on the sidewalls of their gate stack. NMOS 110 includes source NLDD 108 and drain NLDD 109, while PMOS 120 includes source PLDD 118 and drain PLDD 119.

IC 100 is shown including shallow trench isolation structure ("STI") 125 formed within the substrate surface 102 for electrically isolating NMOS 110 and PMOS 120 from other devices 130 including other active devices on the IC 100. However, any conventional isolation structure may generally be used such as field oxidation regions (also known as (LOCal Oxidation of Silicon (LOCOS) regions) or implanted isolation regions.

NMOS 110 includes a p-type pocket (or halo) regions 131 shown extending to the surface of the pwell 111 under the gate dielectric 103, while PMOS 120 includes an n-type pocket (or halo) region 132 shown extending to the surface of the nwell 121 under the gate dielectric 103.

NMOS 110 includes a retrograde DNwell 135 under the NSDs 105, 106, under the NLDDs 108, 109, and under its gate stack 104a/103. DNwell 135 is also shown under the pwell 111. In the case of an SRAM, DNwell 135 under the pwell 111 junction isolates the pwell 111 (or p− substrate if no pwell) to allow bias to be applied during SRAM testing to emulate PBTI. DNwell 135 is also shown under the p+ contact 111a to the pwell 111. A depth of the DNwell 135 can be seen to be shallower below the gate stack 104a/103 as compared to a depth of the DNwell 135 under the NSDs 105, 106 and the NLDDs 108, 109, such as a depth difference of 30 nm to 100 nm. A dielectric layer 136 which may be referred to as a "pre-metal dielectric" (PMD) layer is shown on the surface of the pwell 111 and on the surface of the nwell 121 including between NMOS 110 and PMOS 120. Nwell 121 includes nwell contact 121a.

Figure 1B:
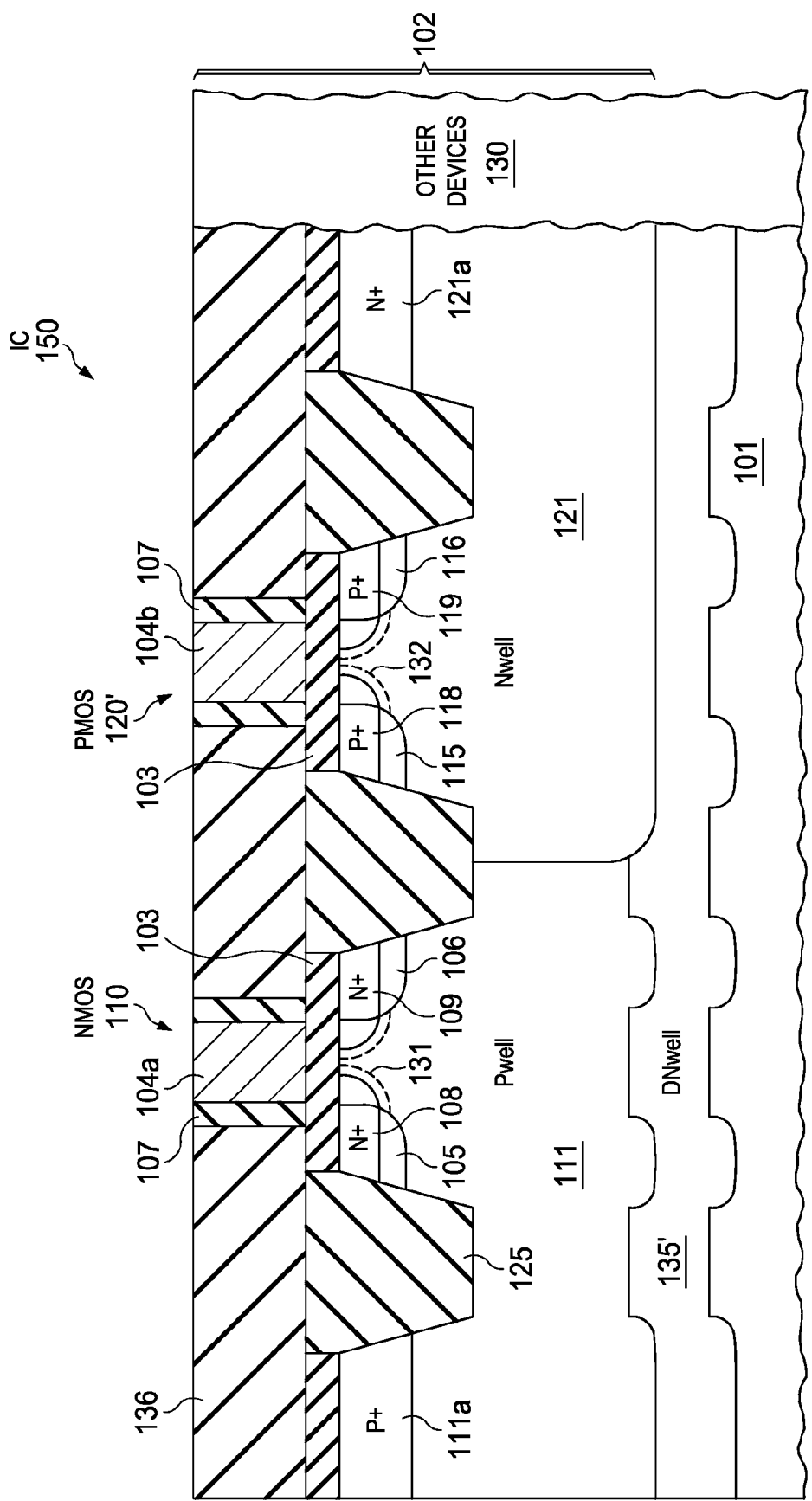
FIG. 1B is a cross-section view of a portion of a CMOS IC including MOS transistors shown as an NMOS transistor and a PMOS transistor after completion of doping and annealing using a fabrication method including forming DNwells through the gate stack for both the NMOS and PMOS transistors, without the need for any added masks according to an example embodiment.

FIG. 1B is a cross-section view of a portion of a CMOS IC 150 including MOS transistors shown as an NMOS transistor 110 (NMOS 110) and a PMOS transistor 120' (PMOS 120') after completion of doping and annealing using a fabrication method including forming DNwells 135' through the gate stack for both NMOS 110 and PMOS 120', without the need for any added masks according to an example embodiment. In the embodiment shown, an implant for the DNwell 135' for NMOS 110 can be performed at the NLDD/p-pocket masking level, while an implant for the DNwell 135' for PMOS 120' can be performed at the PLDD/n-pocket masking level. An optional DNwell for PMOS improves latchup resistance by reducing the base resistance of its parasitic n-base. Alternatively, for some IC devices, the implant for the DNwell 135' can be a blanket (unmasked) implant so that the NMOS and PMOS transistors are implanted together.

Figure 2:
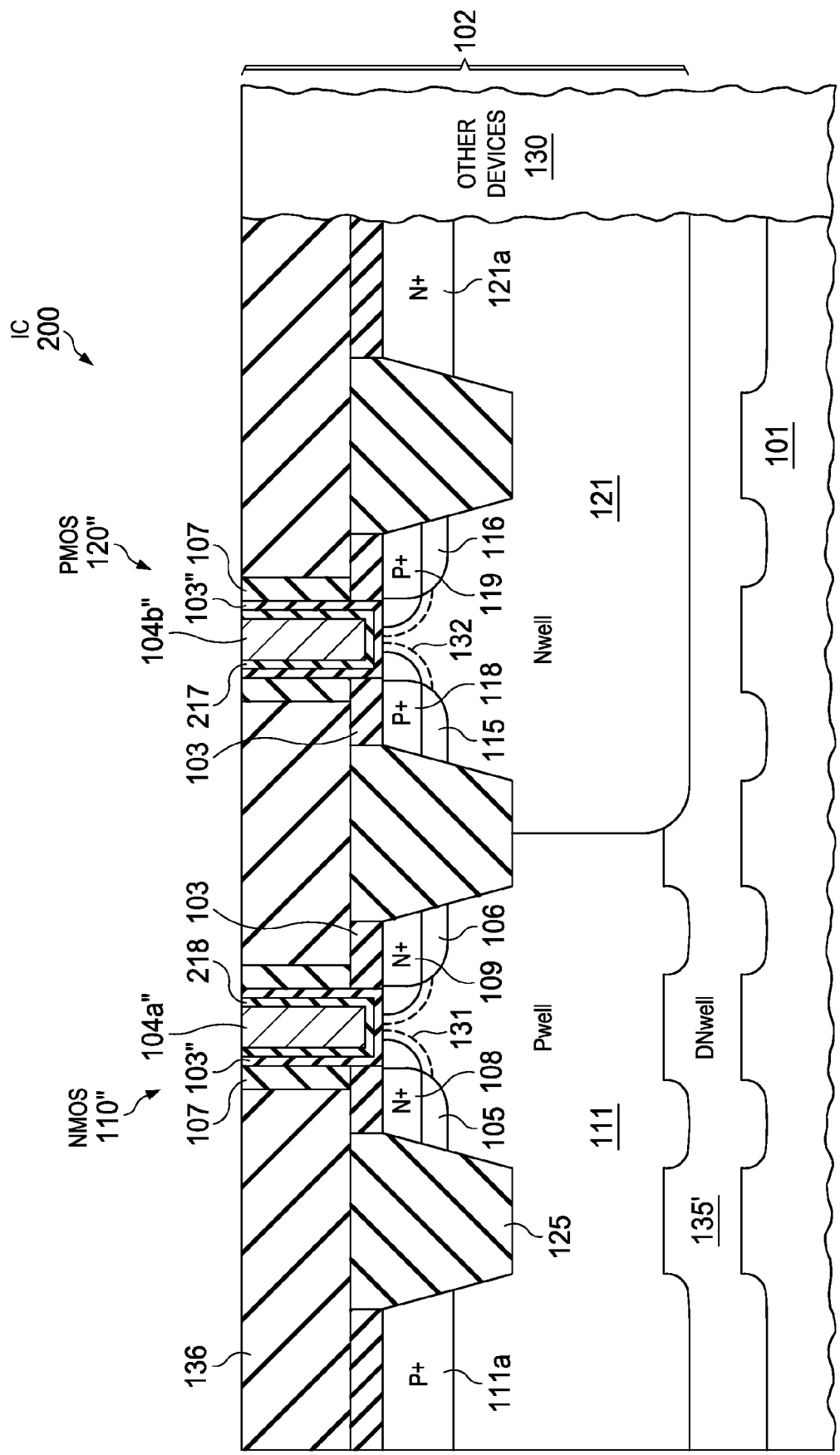
FIG. 2 is a cross-section view of a portion of a CMOS IC including MOS transistors shown as an NMOS transistor and a PMOS transistor after completion of doping and annealing using a fabrication method including forming DNwells through the gate stack for both the NMOS and PMOS transistors, without the need for any added masks according to an example embodiment.

FIG. 2 is a cross-section view of a portion of a CMOS IC 200 based on CMOS IC 150 shown in FIG. 1B modified to have gate stacks reflecting a replacement metal gate process flow. MOS transistors are now shown as an NMOS transistor 110" and PMOS transistor 120" after completion of doping and annealing using a fabrication method including forming DNwells through the gate stack for both NMOS 110" and PMOS 120", without the need for any added masks, and replacement gate processing, according to an example embodiment. In a typical replacement gate flow, the gate electrodes 104a and 104b shown in FIG. 1A and FIG. 1B (e.g., polysilicon) are removed to form trenches. The original gate dielectric 103 lateral to the trenches may also be partially or completely removed. A high-k dielectric 103" may then be formed on the surface of the integrated circuit and in the trenches where the polysilicon gates (or other gate electrode material) are removed.

The high-k dielectric 103" may include an interface layer of silicon dioxide (SiO$_2$) grown or deposited on the substrate surface 102 and/or a deposited layer of a dielectric such as hafnium oxide, hafnium silicon oxynitride, lanthanum oxide, zirconium oxide, or aluminum oxide. The dielectric constant k of the high-k dielectric 103" is defined herein to be at least 5, and may range from 5 to 1,000, which is greater than the k value of SiO$_2$ (3.9). In an example embodiment the high-k dielectric 103" includes of about 0.5 nm of SiO$_2$ plus about 4 nm HfO$_2$.

PMOS and NMOS barrier metal layers may then be deposited and then patterned, in either order, with the PMOS barrier metal layer shown as 217 and the NMOS barrier metal layer shown as 218 in FIG. 2. For example, a thin (e.g., 1-4 nm) PMOS barrier metal layer 217 containing one or more metals from the group of titanium nitride, tantalum nitride, aluminum, and platinum may be deposited followed by a patterning step to remove the barrier over the NMOS regions. Then a thin (e.g., 1-3 nm) NMOS barrier metal layer 218 containing one or more metals from the group of titanium, aluminum, and tungsten may be deposited. In other embodiments, the NMOS barrier metal layer may be deposited first and removed over the PMOS regions using a patterning step, followed by the PMOS barrier metal layer deposition.

The next step involves filling the NMOS and PMOS barrier metal lined gate trenches with a low resistance metal such as aluminum, cobalt-aluminum or tungsten shown as 104a" and 104b" respectively in FIG. 2 to indicate the possibility of different metal materials. Subsequently a CMP step is performed to planarize, remove overlying metal and isolate the NMOS gate electrode 104a" and PMOS gate electrode 104b". Optional thermal anneal steps may be performed at different points in the replacement gate flow to reflow and alloy the various metals to achieve the desired NMOS and PMOS gate work functions.

Figure 3:
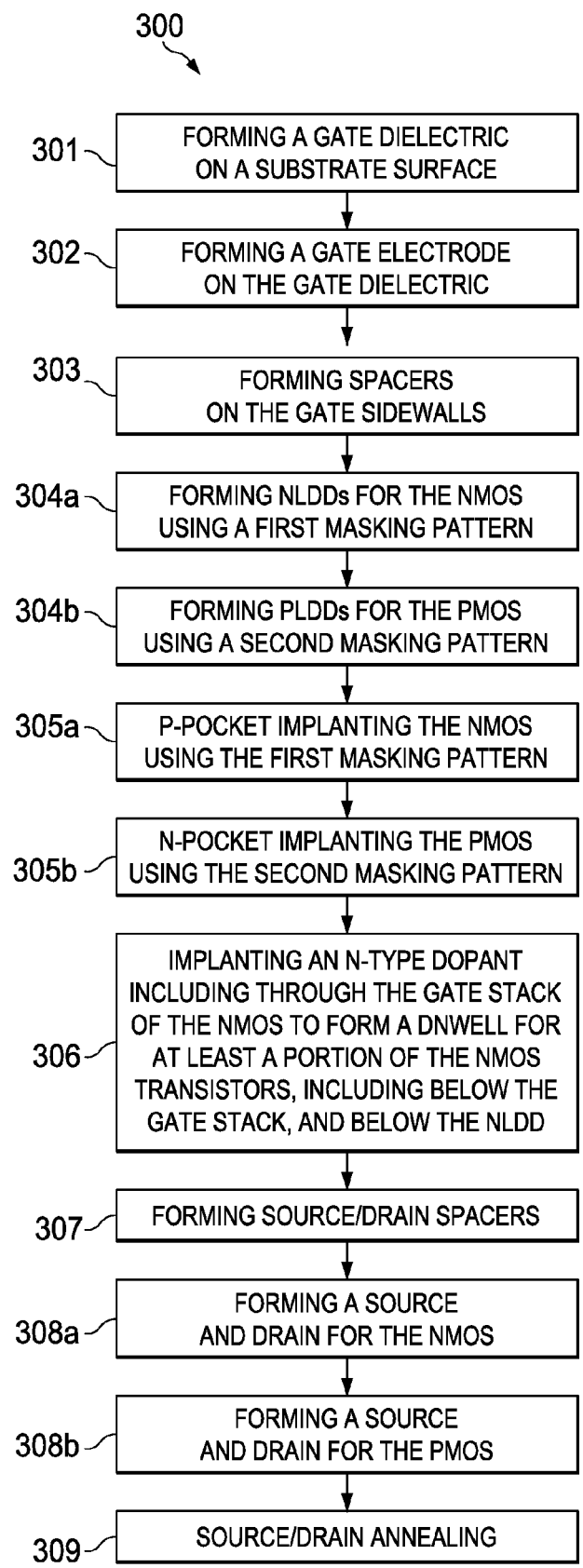
FIG. 3 is a flow chart that shows steps in an example method for forming MOS transistors including forming DNwells through the gate stack for the NMOS transistors, without the need for any added masks, according to an example embodiment.

FIG. 3 is a flow chart that shows steps in an example method 300 for forming MOS transistors including disclosed DNwells which are implanted including through the gate stack for the NMOS, without the need for any added masks, according to an example embodiment. Step 301 comprises formation of the gate dielectric on a substrate surface 102 (or on an optional well formed in the substrate surface). As noted above, the gate dielectric layer 103 can comprise silicon oxide, nitrogen doped silicon dioxide, silicon oxynitride, BST, PZT, hafnium oxide or any other high-k material, or any combination or stack thereof, such as being 1 to 3 nanometers thick. Step 302 comprises forming a gate electrode 104, such as comprised of polysilicon, later doped p-type for PMOS and n-type for NMOS with an optional silicide formed on top. Step 303 comprises forming spacers 107 on the gate sidewalls, such as comprised of oxide, a nitride, an oxynitride or a combination or stack thereof, thereby creating an offset space adjacent to the gate stacks.

Step 304(*a*) comprises formation of the NLDDs for the NMOS using a first masking pattern and step 304(*b*) forming PLDDs for the PMOS using a second masking pattern. The ordering of step 304 is only an example as the LDDs may be created either earlier or later in method 300. Thicker photoresist, such as about 0.7 μm thick, is generally used for the first masking pattern and/or second masking pattern when also used for the implant for the DNwell as disclosed herein to block the DNwell implant in regions covered by resist during the DNwell implant (e.g., PMOS), since the energy/projected range of the DNwell implant is significantly greater as compared to the energy/projected range of the pocket implant (step 305(*a*) and (*b*) described below).

For NMOS, implanting a dopant such as arsenic into the substrate surface 102 or well (e.g., pwell 111 in FIG. 1A, FIG. 1B and FIG. 2) forms the NLDDs 108, 109. The presence of spacer 107 creates a separation between the NLDDs 108, 109 and the gate stacks 104*a*, 103.

The regions of pocket dopant are now formed. Step 305(*a*) comprises a p− pocket implant for NMOS using the first masking pattern (the pattern used for NLDD implant), which after the annealing steps involved in the completion of method 300 provides p− pocket regions 131. This implant is self-aligned to the edge of the gate stack (gate edge). As an example, the first pocket implant dose to form p− pocket regions 131 may be of boron for NMOS or phosphorous for PMOS in the range of $1.0 \times 10^{13}$ atoms/cm² to $6 \times 10^{13}$ atoms/cm² at an energy level of 1 to 30 KeV for boron, or an energy for other species to obtain the same projected range as boron implanted at 1 to 30 Key. Step 305(*b*) comprises a n− pocket implant for PMOS using the second masking pattern (the pattern used for PLDD implant), which after the annealing steps involved in the completion of method 300 provides pocket regions 132. The angle for the pocket implants relative to a normal to the substrate surface 102 generally ranges from 10 to 30 degrees.

As described above, thicker photoresist is generally used to block the DNwell implant in regions covered by resist (e.g., PMOS), since the energy/projected range of the DNwell implant is significant greater as compared to the energy/projected range of the pocket implant (step 305(*a*) and (*b*)). However, thicker photoresist will typically cause shadowing of the angled (e.g. 10 to 30 degrees) pocket implants. Implant rotation, design rule and layout modification can be used to eliminate possible photoresist shadowing during pocket implantation.

Consider SRAMs for example: Since the SRAM may be laid out such that driver transistors and passgate (PG) transistors are adjacent to each other and share the same LDD implants, the SRAM NLDD mask may have open horizontal stripes which expose both driver transistors and PG transistors. If 2 rotation pocket implants are used such that there is no implant perpendicular to the SRAM NLDD resist edge, there will be no pocket implant shadowing in the driver and PG transistors by the SRAM NLDD photoresist edge.

Step 306 comprises implanting an n-type species through the gate stack of the NMOS to form a retrograde DNwell for at least a portion of the NMOS transistors, including below the gate stack, and below the NLDD. The same first masking pattern (the pattern used for NLDD and pocket implants) can be used for implanting the retrograde DNwell. In the case of SRAM, as described above, the mask used for the NLDD/p− pocket and DNwell for NMOS can also expose the pwell contact (or p-substrate contact) to the SRAM NLDD implant and DNwell for junction isolation from the substrate. As described above, a result in the complete IC of implanting through the gate stack is that a depth of the DNwell is shallower below the gate stack of the NMOS as compared to a depth of the DNwell under the NSD and NLDD regions (as shown in FIG. 1A, FIG. 1B, and FIG. 2). As described above, the DNwell may also optionally be implanted with the mask used for the PLDD implant (step 304(*b*)) for the PMOS transistors.

The implant to form the DNwell can comprise arsenic, phosphorous and/or antimony. For 65 nm technology with a trench isolation depth of about 300 to 350 nm, in one specific example, the DNwell implant can comprise phosphorus $5 \times 10^{13}$ cm⁻² at an energy of 450 keV, angle of 2 degrees, with 4 rotations. For more advanced technologies, such as 28 nm with trench depth of about 200 nm, the DNwell implant can comprise in one particular embodiment a phosphorus implant at a dose of $5 \times 10^{13}$ cm⁻², at an energy of 350 keV, an angle of 2 degrees, with 4 rotations.

The implant to form the DNwell may also use a low temperature to reduce end of range damage from the DNwell implant. For example, this implant may be performed in an ion implanter at a temperature of −50° C. to −150° C., such as about −100° C. (173 K) using liquid nitrogen cooling.

The method can further comprise implanting at least one of fluorine, nitrogen and carbon "co-implants" using the same masking pattern as the LDD/pocket implant to form the DNwell to reduce diffusion of the dopants and to modify LDD/pocket and DNwell doping profiles. Si or Ge may also be used as co-implant species. The co-implant dose (e.g., fluorine) may be in the range of $5 \times 10^{13}$ atoms/cm² to $1 \times 10^{15}$ atoms/cm². The co-implant energy is generally selected to implant the co-implant species to approximately the same depth as the pocket dopants and/or DNwell dopant. The co-implant can precede steps 305(*a*), 305(*b*), and 306. It is noted the ordering of the steps 305 (*a*), 305(*b*), and 306 is by example since the pocket implants may be created either earlier or later in the process.

An additional laser or flash lamp anneal, also referred to as a Ultra-High Temperature (UHT) anneal, may be performed after the LDD/pocket and DNwell implants to reduce DNwell implant induced lattice damage. As used herein, an UHT anneal comprises annealing conditions that provide a peak anneal temperature of between 1000° C. and 1400° C., and an anneal time at the peak temperature of generally ≤1 second, and typically between 0.1 msec to 10 msec. In one embodiment the laser or flash lamp anneal may be followed by a non-melt spike anneal or Rapid Thermal Anneal (RTA). Typical spike anneal and RTA temperatures are in the range of 900-1100° C., with anneal times at peak temperature ranging from about 100 msec (for spike anneal) to a few seconds (for RTA). The Spike/RTA anneal and flash/laser UHT anneal can be performed in either order.

Step 307 is the formation of the source/drain spacers. The source/drain spacers can comprise an oxide/nitride stack, but alternatively an oxide, a nitride, an oxynitride, or any suitable material. The presence of source/drain spacers creates proper separation between the source/drain extension regions and the source or drain.

Step 308(*a*) is the formation a source and drain for NMOS and step 308(*b*) formation a source and drain for PMOS. For NMOS in step 308(*a*), a dopants such as Arsenic and/or Phosphorus can be implanted into the pwell 111 at the source region 105 and the drain region 106. For PMOS in step 308(*b*), a dopant such as boron can be implanted directly or in the form of $BF_2$ into the nwell 121 at the p+ source region 115 and the p+ drain region 116. Co-implants of species such as nitrogen, carbon, fluorine and indium may be performed in step 308(a) for NMOS and/or PMOS. These implants are typically used to control dopant diffusion and reduce/eliminate defect formation in subsequent silicide processing. The source-drain formation step 308 may also include typical process modifications to create embedded SiGe stressor regions in PMOS and heavily doped silicon epi/embedded silicon carbide stressor regions in the NMOS. These embedded stressors in the source and drain regions impart stress to the transistor channel enhancing NMOS and PMOS performance.

Step 309 comprises an annealing step which may be referred to as a source/drain anneal. Annealing provides high temperature thermal process conditions sufficient to cause the dopants to diffuse to their desired locations. Step 309 is typically preceded by a stress memorization layer (SMT) typically nitride/oxide deposition. During the annealing step the SMT transfers stress to the NMOS transistors in the die increasing their performance. The SMT layer is removed after step 309.

As noted above, the method can include the optional steps of replacement gate processing. The original gate electrodes, such as polysilicon gate electrodes, for at least one of the PMOS transistors and the NMOS transistors can be removed following source/drain anneal 309 to form gate trenches using a suitable etch process. As described above, in a typical replacement gate flow for NMOS and PMOS, the gate electrodes 104a and 104b shown in FIG. 1A or FIG. 1B (e.g., polysilicon) are removed as well as at least a portion of their gate dielectrics 103 and a high-k dielectric layer 103" is deposited. Moreover, as described above, the high-k dielectric 103" may include an interface layer of silicon dioxide ($SiO_2$) grown/deposited on the surface of the substrate and/or a deposited layer of dielectric such as hafnium oxide, hafnium silicon oxynitride, lanthanum oxide, zirconium oxide, and aluminum oxide. Subsequent steps in the replacement gate flow include PMOS barrier metal deposition, pattern and removal from NMOS regions followed by NMOS barrier metal deposition. The last steps in the replacement gate flow are gapfill with low resistance metal and CMP polishing to isolate the NMOS metal gate electrode 104a" from the PMOS metal gate electrode 104b".

The choice of barrier metal is based on work function considerations. The PMOS barrier metal may include one or more metals from the group of titanium nitride, tantalum nitride, aluminum, and platinum. The NMOS barrier metal may contain one or more metals from the group of titanium, aluminum, and tungsten. The low resistance gap fill metal usually comprises Aluminum, Cobalt-Aluminum or Tungsten.

The manufacturing process continues generally through conventional back end of the line (BEOL) processing including silicide for polysilicon gate embodiments, contact processing, then multi-layer metallization and passivation until the final structure of the IC is completed.

In one embodiment, the IC such as a Digital Signal Processor (DSP) IC includes Static Random Access Memory (SRAM) blocks and logic blocks. Typically, the SRAM block contains several thousand to several million bit cells, each bit cell generally including 6 (6T) or 8 transistors. The 6T SRAM cell has 2 PMOS load (pull up) transistors, 2 NMOS driver (pull down) transistors and 2 NMOS pass gate (write access) transistors. These transistors are typically relatively narrow in size to reduce the cell area and have a higher relative threshold voltage (Vt) to lower their leakage. The higher Vt is usually achieved by a separate higher dose Vt implant and/or higher dose pocket/halo implants. Logic blocks contain Boolean logic gates (e.g. NAND, NOR, etc.) flip flops, clocks etc. are generally made up of "core" transistors. These core transistors are generally relatively wider and have a smaller gate length than the SRAM transistors to enable higher speed operation. The Vt of the core logic transistors can vary depending on circuit application. In low leakage ICs, the core transistors can have high Vt and share the same higher dose Vt and/or pocket/halo implants of the SRAM driver and PG transistors. In speed critical paths, the core transistors can have lower Vt and not receive the higher dose Vt and/or pocket/halo implants.

In one embodiment, a portion of the core logic NMOS transistors and the SRAM NMOS PG and driver transistors may receive the same NLDD, p-pocket/halo and DNwell implants using a common mask, while some low Vt NMOS logic transistors may be masked on the common mask from these implants. Additionally, a portion of the logic and SRAM transistors that receive these implants may receive additional pocket/halo implants using a separate mask to raise their Vt (e.g., high density (HD) bits). Thus, by using this embodiment, both logic and SRAM transistors having different Vts can be both created in a disclosed DNwell.

The SRAM can include different bit arrangements, including HD bits and higher performance (HP) bits. As used herein, HD bits include relatively small area transistors, usually having a higher Vt and lower leakage as compared to HP bits which have larger areas (typically wider), a lower Vt and higher leakage as compared to HD bit transistors. Typically the HD bit transistors receive their own dedicated LDD and pocket/halo implants to help set the Vt, while the HP bit transistors can share the LDD and pocket implants with the logic (core) transistors.

To provide an added diode for back bias for weak bit screening capability for both HD bits and HP bits, the same NLDD, p-pocket and DNwell implant mask can be used to provide NLDD, DNwell and pockets for both the HD and HP bits. To provide different Vts between HD and HP bits, the logic Vt/pocket/halo implants can be used for the HD bit transistors to raise their Vt as compared to the HP bit transistors. This provides a disclosed DNwell for both HD and HP bits, which allows for weak bit screening on both.

Figure 4:
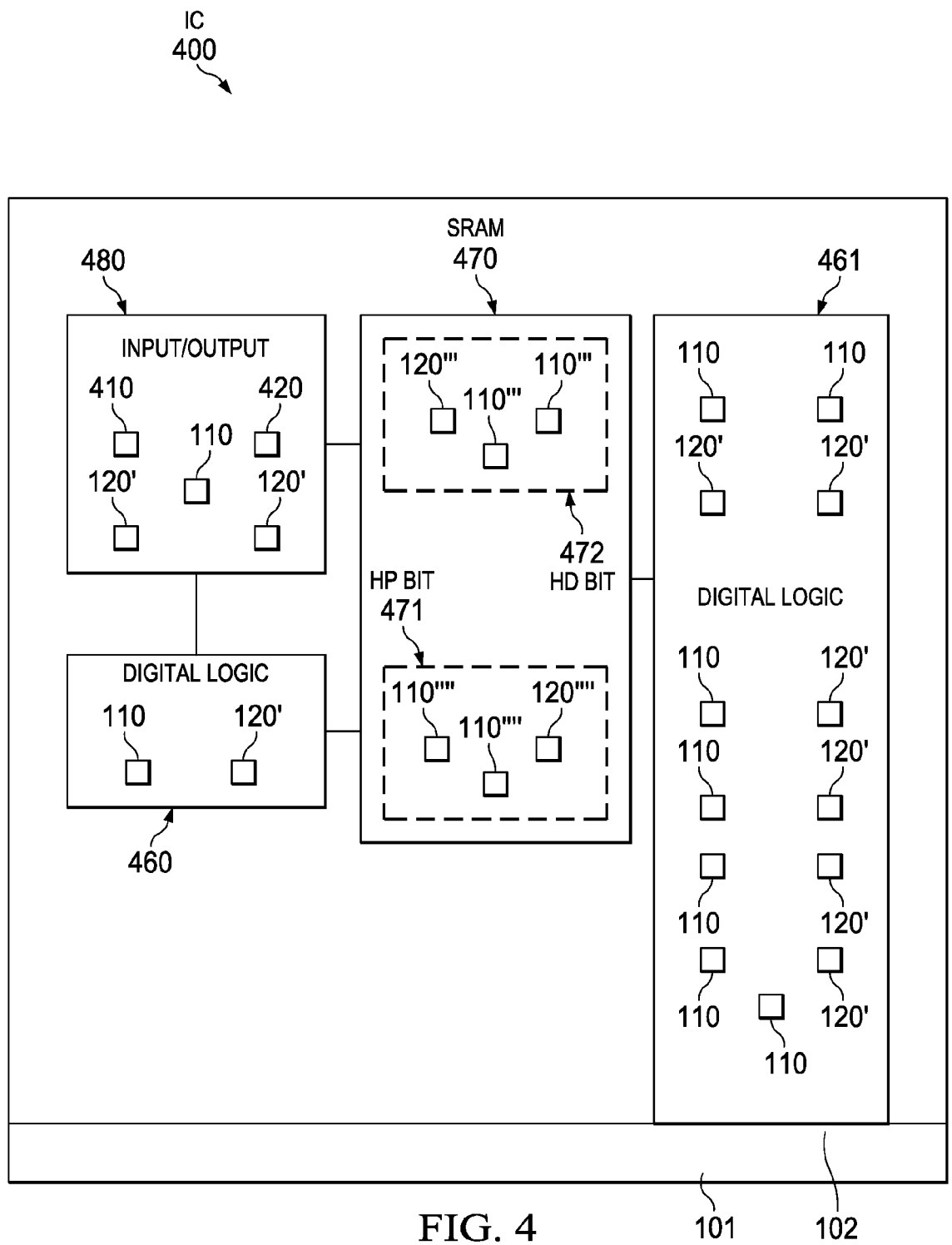
FIG. 4 is a block diagram depiction of an example IC including a plurality of functional blocks including digital logic blocks, a SRAM block and an I/O block, where at least a portion of the NMOS transistors on the IC include DNwells which are shallower below the gate stack as compared to a depth of the DNwell under the NLDD regions, according to an example embodiment.

FIG. 4 is a block diagram depiction of an example IC 400 including a plurality of functional blocks including digital logic blocks 460 and 461, a static ram (SRAM) block 470 and an Input/Output (I/O) block 480, wherein at least a portion of the NMOS transistors on the IC 400 include disclosed DNwells which are shallower below the gate stack as compared to a depth of the DNwell under the NLDD regions, according to an example embodiment. IC 400 is shown including a substrate 101 having a substrate surface 102 comprising a semiconductor material having p– regions (where NMOS are formed) and n– regions (where PMOS are formed). The NMOS transistors in the digital logic blocks 460 and 461 include core NMOS transistors and core PMOS transistors shown as 110 and 120' respectively, that as described above both include a disclosed DNwell.

SRAM block 470 shown in FIG. 4 is configured as a plurality of bits, namely HD bits shown as HD bit 472 and HP bits shown as HP bit 471, which can both be arranged in 6T or 8T cell configurations. These bits contain non-core NMOS (e.g. PG and driver) transistors (shown as NMOS''' in HD bit 472 and NMOS'''' in HP bit 471) which both include a disclosed DNwell. Also contained in these bits are non-core PMOS load transistors (shown as PMOS''' in HD bit 472 and PMOS'''' in HP bit 471) which may include an optional DNwell. As disclosed above, the respective transistors in HP bit 471 and HD bit 472 can have different Vts (e.g., using LVT pocket implants differentiating the HP transistors (low Vt) and HD bit transistors (higher Vt), for example. The transistors in I/O block 480 are shown as including transistors 410, 420 which lack a disclosed DNwell, and disclosed transistors shown as NMOS 110 and PMOS 120' including a disclosed DNwell. It will be apparent to one skilled in the art that the transistors in the respective blocks (digital logic blocks 460 and 461, SRAM 470, and I/O block 480) can have different widths, lengths, gate dielectric thicknesses, and Vt implant adjusts (and thus different Vts).

Disclosed embodiments can be integrated into a variety of assembly flows to form a variety of different semiconductor IC devices and related products. Assembled devices can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating a Complementary Metal-Oxide Semiconductor (CMOS) integrated circuit (IC), comprising:
    implanting a first n-type dopant at a first masking level that exposes a p-region of a substrate surface of a substrate having a first gate stack thereon for forming n-type lightly doped drain regions (NLDD regions) to provide n-source/drain extension regions for at least a portion of a plurality of n-channel MOS (NMOS) transistors on said IC;
    implanting a p-type dopant at second masking level that exposes an n-region of said substrate surface having a second gate stack thereon for forming p-type lightly doped drain regions (PLDD regions) to provide p-source/drain extension regions for at least a portion of a plurality of p-channel MOS (PMOS) transistors on said IC, and
    retrograde implanting a second n-type dopant including through said first gate stack to form a deep nwell (DNwell) for said portion of said plurality of NMOS transistors, wherein a depth of said DNwell is shallower below said first gate stack as compared to a depth of said DNwell under said NLDD regions, and wherein said retrograde implanting is also performed with a mask used for said first masking level.

2. The method of claim 1, wherein said p-region includes a p-contact, and wherein said p-contact is exposed by said mask for said portion of said plurality of NMOS transistors so that said p-contact receives said implanting said first n-type dopant and said retrograde implanting.

3. The method of claim 1, wherein said retrograde implanting is also performed in another step with a mask used for said second masking level.

4. The method of claim 1, further comprising p-type pocket implanting said portion of said plurality of NMOS transistors with a mask used for said first masking level, wherein said p-type pocket implanting utilizes at least 2 different rotations.

5. The method of claim 1, wherein said first gate stack and said second gate stack both comprise polysilicon on silicon oxynitride (SiON).

6. The method of claim 1, wherein said retrograde implanting is performed at a temperature of -50° C. to -150° C.

7. The method of claim 1, wherein said IC includes a static random access memory (SRAM) including driver transistors, pass gate (PG) transistors, and logic transistors.

8. A method of fabricating a Complementary Metal-Oxide Semiconductor (CMOS) integrated circuit (IC), comprising:
    implanting a first n-type dopant at a first masking level that exposes a p-region of a substrate surface of a substrate having a first gate stack thereon for forming n-type lightly doped drain regions (NLDD regions) to provide n-source/drain extension regions for at least a portion of a plurality of n-channel MOS (NMOS) transistors on said IC;
    implanting a p-type dopant at second masking level that exposes an n-region of said substrate surface having a second gate stack thereon for forming p-type lightly doped drain regions (PLDD regions) to provide p-source/drain extension regions for at least a portion of a plurality of p-channel MOS (PMOS) transistors on said IC, and
    retrograde implanting a second n-type dopant including through said first gate stack to form a deep nwell (DNwell) for said portion of said plurality of NMOS transistors, wherein a depth of said DNwell is shallower below said first gate stack as compared to a depth of said DNwell under said NLDD regions;
    wherein said IC includes a static random access memory (SRAM) including driver transistors, pass gate (PG) transistors, and logic transistors, and wherein said portion of said plurality of NMOS transistors includes said driver transistors and said PG transistors, and wherein said retrograde implanting is excluded from at least selected ones of said logic transistors so as to not form said NLDD regions or said DNwell.

9. The method of claim 8, wherein said selected ones of said logic transistors include said DNwell, and said method includes another NLDD masking level and implant to form logic NLDD regions which have a lower doping level as compared to said NLDD regions.

10. The method of claim 7, wherein said SRAM includes high density (HD) bits and higher performance (HP) bits, and wherein a first portion of said portion of said plurality of NMOS transistors are included in both said HD bits and said HP bits, and wherein said first portion of said plurality of NMOS transistors within said HD bits and said first portion of said plurality of NMOS transistors within said HP bits receive different pocket implants so that said first portion of said plurality of NMOS transistors within said HD bits have a higher threshold voltage (Vt) as compared to said first portion of said plurality of NMOS transistors within said HP bits.

* * * * *